(12) United States Patent
Hamada et al.

(10) Patent No.: US 11,525,877 B2
(45) Date of Patent: Dec. 13, 2022

(54) MAGNETIC RESONANCE IMAGING APPARATUS, SUBJECT POSITIONING DEVICE, AND SUBJECT POSITIONING METHOD

(71) Applicant: Hitachi, Ltd., Tokyo (JP)

(72) Inventors: Kota Hamada, Tokyo (JP); Hikaru Hanada, Tokyo (JP); Hideyuki Horio, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 0 days.

(21) Appl. No.: 17/242,666

(22) Filed: Apr. 28, 2021

(65) Prior Publication Data

US 2022/0099764 A1 Mar. 31, 2022

(30) Foreign Application Priority Data

Sep. 29, 2020 (JP) .............................. JP2020-163586

(51) Int. Cl.
*G01R 33/30* (2006.01)
*G01R 33/56* (2006.01)
*G01R 33/54* (2006.01)

(52) U.S. Cl.
CPC ......... *G01R 33/307* (2013.01); *G01R 33/543* (2013.01); *G01R 33/5608* (2013.01)

(58) Field of Classification Search
CPC ................ G01R 33/307; G01R 33/543; G01R 33/5608; G01R 33/3664
See application file for complete search history.

(56) References Cited

U.S. PATENT DOCUMENTS 5,066,915 A * 11/1991 Omori .................. G01R 33/543
324/318
2012/0319689 A1* 12/2012 Ichinose ............ G01R 33/3664
324/322
2017/0311842 A1 11/2017 Boettger et al.

* cited by examiner

*Primary Examiner* — G. M. A Hyder
(74) *Attorney, Agent, or Firm* — Mattingly & Malur, PC

(57) ABSTRACT

An imaging target site of a subject can be automatically aligned with imaging space, without using additional hardware. A nuclear magnetic resonance signal received by a receiver coil arranged at the imaging target site of the subject is used to calculate a position of the receiver coil. A table on which the subject is placed is moved in a manner to align the position of the receiver coil with the imaging space of the magnetic resonance imaging apparatus. With this configuration, the imaging target site of the subject can be aligned with the imaging space of the magnetic resonance imaging apparatus.

10 Claims, 19 Drawing Sheets

FIG. 4

| IMAGING TARGET SITE | | RECOMMENDED RECEIVER COIL |
|---|---|---|
| Head and Neck | | |
| Spine | | Spine Coil |
| Upper Extremity | | Torso Coil |
| Lower Extremity | | |
| Chest | | |
| Abdomen | General Abdomen / Liver | |
| | Kidney / Vascular | |
| Pelvis | | |
| Whole Body | | |

FIG. 7

| GENDER (M:Male/F:Female) | AGE | STATISTICAL HEIGHT[cm] |
|---|---|---|
| M | 2 OR YOUNGER | 86.4522 |
| M | 3 | 95.27359 |
| M | ... | ... |
| M | 19 | 176.6179 |
| M | 20 OR OLDER | 176.8492 |
| F | 2 OR YOUNGER | 84.97566 |
| F | 3 | 94.21336 |
| F | ... | ... |
| F | 19 | 163.259 |
| F | 20 OR OLDER | 163.3383 |

FIG. 8

| IMAGING SITE | HEIGHT | | | | |
|---|---|---|---|---|---|
| | 190cm | ... | 175cm | ... | 160cm |
| Brain | 0 | ... | 0 | ... | 0 |
| Neck | 0 | ... | 0 | ... | 0 |
| C-Spine | 0 | ... | 0 | ... | 0 |
| Chest | 21 | ... | 17 | ... | 16 |
| T-Spine | 31 | ... | 28 | ... | 26 |
| Liver | 46 | ... | 42 | ... | 39 |
| L-Spine | 56 | ... | 51 | ... | 46 |
| Pelvis | 101 | ... | 92 | ... | 84 |
| Knee | | | | | |

FIG. 13
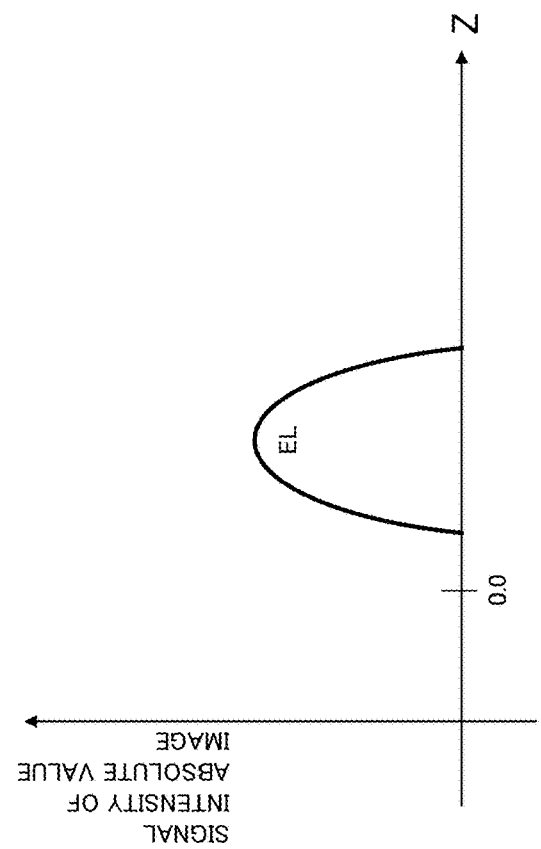
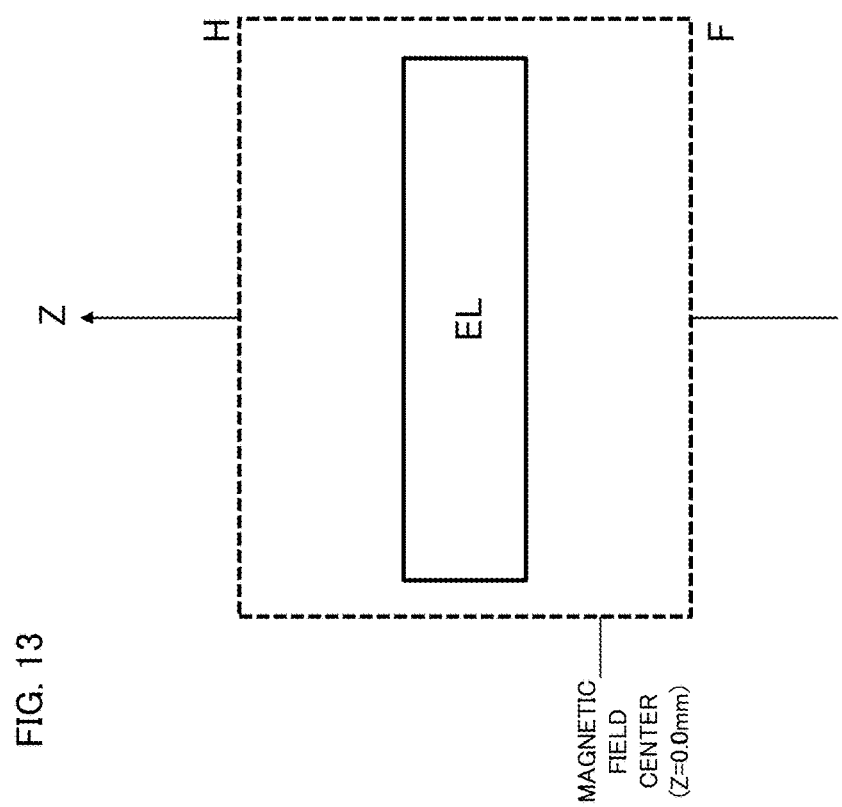

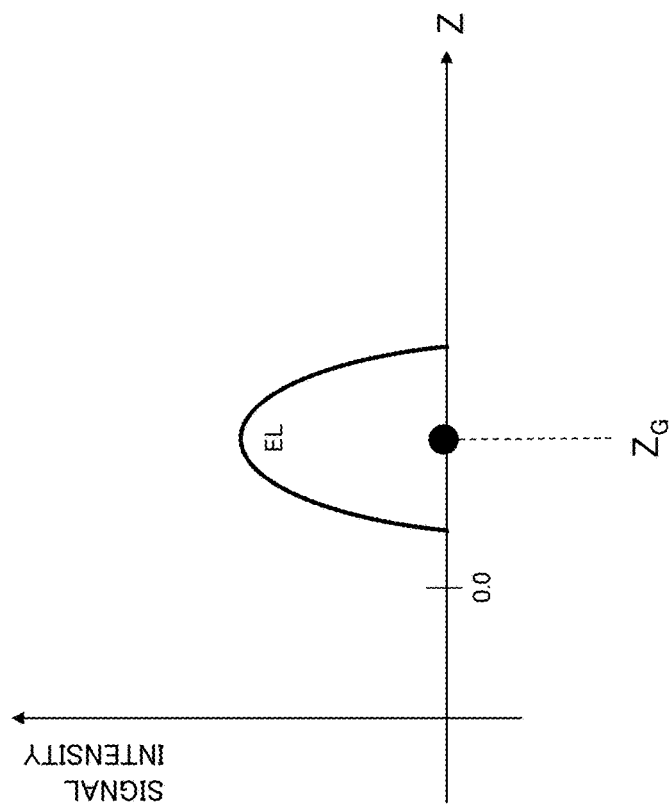
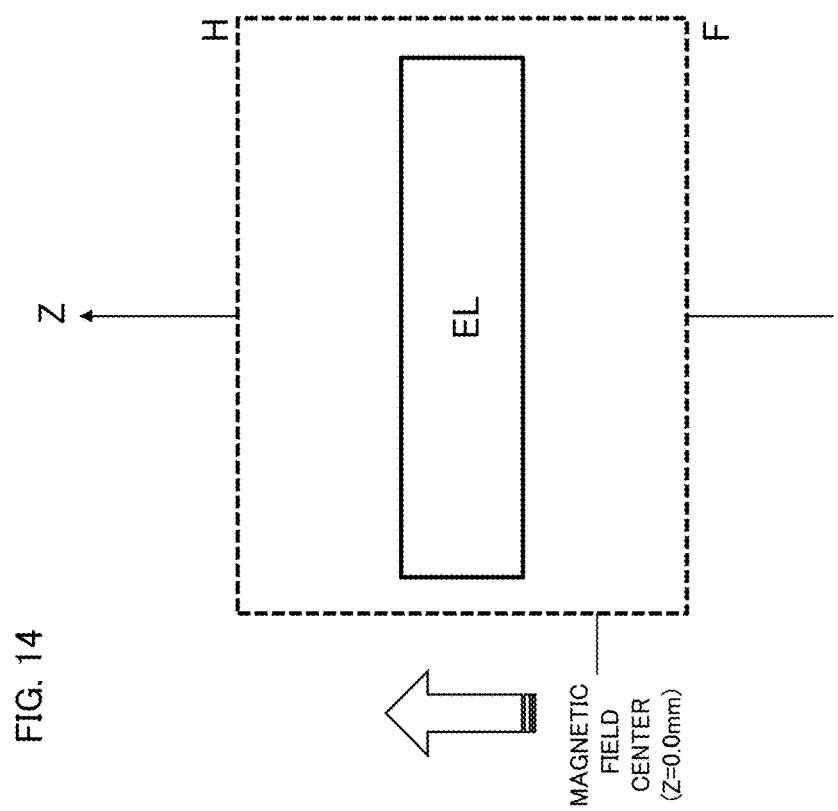
FIG. 14

MAGNETIC RESONANCE IMAGING APPARATUS, SUBJECT POSITIONING DEVICE, AND SUBJECT POSITIONING METHOD

CROSS-REFERENCE TO RELATED APPLICATION

The present application claims priority from Japanese application JP2020-163586, filed on Sep. 29, 2020, the contents of which is hereby incorporated by reference into this application.

BACKGROUND OF THE INVENTION

Field of the Invention

The present invention relates to a magnetic resonance imaging (hereinafter, referred to as "MRI") apparatus, and more particularly, it relates to a technique for improving an operator's workflow to perform subject setting.

Description of the Related Art

The MRI apparatus measures a nuclear magnetic resonance (NMR) signal generated from a nuclear spin constituting tissue of a subject, particularly a human body, to create images of shapes and functions of the head, abdominal region, limb, and others two-dimensionally or three-dimensionally. In the imaging, the subject is placed in a uniform static magnetic field space generated from a static magnetic field magnet of the MRI apparatus, a RF magnetic field pulse is emitted from a transmit coil, and a gradient magnetic field pulse is applied from the gradient magnetic field coil. The nucleus of the subject tissue irradiated with the RF magnetic field pulse generates a NMR signal, and the gradient magnetic field pulse imparts phase encoding and frequency encoding to the NMR signal. A receiver coil measures the NMR signal as time series data. Thus measured NMR signals are subjected to two-dimensional or three-dimensional Fourier transform and reconstructed into an image.

Imaging space of the MRI apparatus is capable of forming the uniform static magnetic field space with a predetermined or higher precision, also being a region to which a predetermined gradient magnetic field pulse can be applied, and this imaging space is determined in advance by design. Therefore, the operator is required to place an imaging target site of the subject within the imaging space.

A procedure of the operator conventionally performed to set the subject in the imaging space is as follows: First, the subject is laid on a table that is installed in the MRI apparatus, and the operator performs manipulation to move the table so that the vicinity of the imaging target site is positioned in the center of the static magnetic field. Next, the operator applies a laser to the subject from a unit provided in the MRI apparatus, while visually checking the site irradiated with the laser, and the operator further performs manipulation to move the table for fine adjustments, so that the imaging target site is disposed in the center of the static magnetic field.

However, such visual positioning of the table is a burden on the operator. Further, when examination is performed on the same subject over multiple times for progress observation, there may occur a problem that the setting position of the subject is subtly different each time of the examination. Also, as an incidental problem, there is a risk that the laser used for the position adjustment may enter the subject's eyes. In addition, when the positioning is performed using the laser, it is necessary to move the table finely and many times, which may cause the subject to feel uncomfortable. Therefore, in recent years, there are increased demands for improving efficiency in imaging and reproducibility of imaging. One of such demands is automation of the subject setting.

In U.S. Patent Application Publication No. 2017/0311842 (hereinafter, referred to as "Patent Document 1"), there is suggested a positioning method in which a position where a table should be placed is calculated according to a height and other information of a subject and the table is moved to the calculated position. Specifically, first, on the basis of examination data (age, gender, and imaging target site) selected by the operator, a position of the table that allows the imaging target site to be placed in the imaging space is roughly calculated from learning data. Next, the height and weight of the subject are measured using a sensor, and by using the measurement result, a correction amount of the table position is calculated. Then, the table is moved to the table position that is determined according to the workflow as described above.

SUMMARY OF THE INVENTION

Problems

Patent Document 1 discloses a technique for calculating an amount of table movement to place the imaging target site in the imaging space of the MRI apparatus, on the basis of the height and weight of the subject. However, there is no consideration regarding a positional relationship between a receiver coil attached to the subject and the imaging space.

That is, the operator provides the receiver coil in proximity to the imaging target site in such a manner that a sensitivity region of the receiver coil includes the actual imaging target site. Therefore, the actual imaging target site corresponds to the region where the receiver coil is attached. For example, a body coil, being the receiver coil used for Anterior (the front) side of the body, can be attached to a desired position on the body in the space on the top plate of the table, and the operator mounts the body coil above the imaging target site.

Therefore, the actual imaging target site may be displaced from the imaging target site that is calculated based on the height and the body weight of the subject, and thus it is desirable to place the center of the receiver coil in the center of the static magnetic field (the center of the imaging space). However, according to the conventional technique, the position of the receiver coil is not considered, and therefore, a part of the sensitivity region of the receiver coil may deviate from the imaging space, resulting in that an image corresponding to the deviated portion may fail to be created.

In addition, in the technique of Patent Document 1, the sensor is used for measuring the height and weight of the subject. Thus it is necessary to install the sensor in the MRI apparatus in advance, and this may result in an increase in cost.

Given this situation, an object of the present invention is to perform automatic positioning of the imaging target site of the subject so that it is aligned with the imaging space, without using additional hardware.

In order to achieve the object above, a MRI apparatus of the present invention includes a static magnetic field generator configured to generate a static magnetic field in imaging space, a receiver coil configured to receive a nuclear magnetic resonance signal emitted from a subject, a table configured to place the subject thereon and to move the subject to the imaging space, and a subject positioning unit configured to control movement of the table to perform positioning for aligning an imaging target site of the subject with the imaging space. The subject positioning unit determines the position of the receiver coil, using the nuclear magnetic resonance signal received by the receiver coil arranged at the imaging target site of the subject, and moves the table so that the position of the receiver coil is aligned with the imaging space.

According to the present invention, the position of the receiver coil is obtained using the nuclear magnetic resonance signal received by the receiver coil arranged at the imaging target site of the subject. Then, aligning the position of the receiver coil with the imaging space allows the imaging target site of the subject to be automatically positioned in the imaging space, without using additional hardware.

BRIEF DESCRIPTION OF THE DRAWINGS

FIG. 4 is a screen example showing a screen for selecting an imaging target site and a screen for displaying recommended receiver coils according to the first, the second, the third, and the fourth embodiments;

FIG. 7 is a table showing a predetermined relationship between gender, age, and height according to the first embodiment;

FIG. 8 is a table showing distance from the predetermined reference position (cervical flexion) to the target examination sites on a height basis, according to the first embodiment;

FIG. 10B-1 is a graph showing profiles of signal intensity of absolute value images obtained from the NMR signals in a uniform phantom, respectively for the elements using the receiver coil of FIG. 10A, and FIG. 10B-2 is a graph showing the profiles of the signal intensity of the absolute value images obtained from the NMR signals of the subject, respectively for the elements using the receiver coil of FIG. 10A;

FIG. 13 illustrates a configuration of the receiver coil comprising one element and the signal intensity profile of the absolute value image obtained from the NMR signal in the uniform phantom using the receiver coil according to the second embodiment;

FIG. 14 illustrates the receiver coil comprising one element according to the second embodiment, the center of the static magnetic field, and the center of gravity of the signal intensity profile of the absolute value image;

DETAILED DESCRIPTION OF THE PREFERRED EMBODIMENTS

Figure 1:
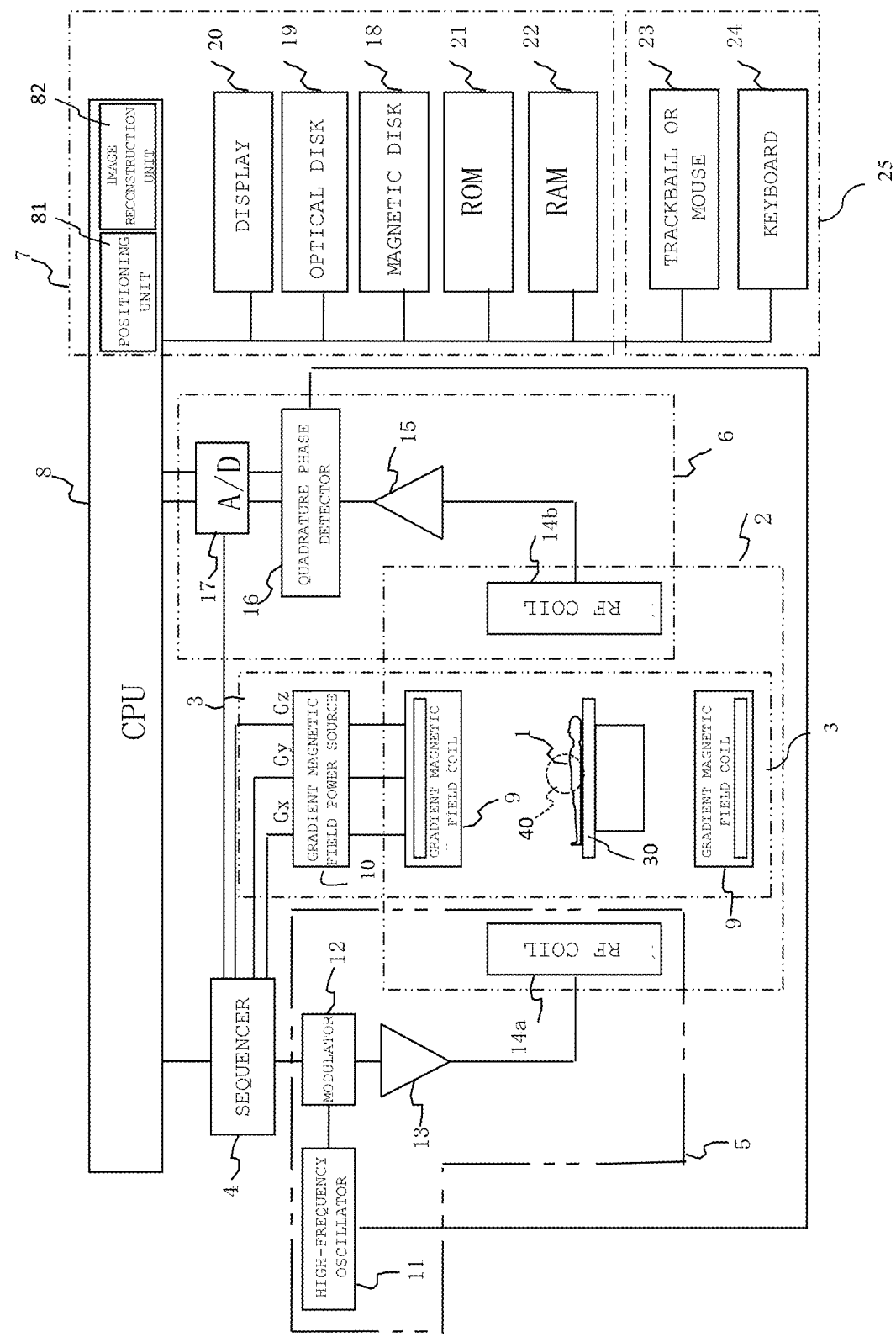
FIG. 1 illustrates an overall configuration of an MRI apparatus according to an embodiment of the present invention.

There will now be provided a detailed description of an MRI apparatus according to an embodiment of the present invention with reference to the accompanying drawings. In the following description, those having the same functions are denoted by the same reference numerals, and the description thereof will not be provided redundantly.

First, with reference to FIG. 1, an overall outline of one example of the MRI apparatus according to the present embodiment will be described. FIG. 1 is a block diagram showing the overall configuration of the MRI apparatus according to the present embodiment.

The MRI apparatus is intended to obtain a tomographic image of a subject by utilizing NMR phenomenon, and as shown in FIG. 1, the MRI apparatus comprises a static magnetic field generating system 2, a gradient magnetic field generating system 3, a transmission system 5, a reception system 6, a signal processing system 7, a sequencer 4, and a central processing unit (CPU) 8.

The static magnetic field generating system 2 has a configuration in which the subject 1 is surrounded by a static magnetic field source, such as a permanent magnet system, a normal conducting system, and a superconducting system. In the case of a vertical magnetic field system, the static magnetic field source generates a uniform static magnetic field in the space around the subject 1 in a direction perpendicular to the body axis thereof, and in the case of a horizontal magnetic field system, the uniform static magnetic field is generated in the body axis direction.

The gradient magnetic field generating system 3 comprises a gradient magnetic field coil 9 for applying gradient magnetic fields Gx, Gy, and Gz in the three-axis directions X, Y, and Z of the coordinate system (stationary coordinate system) of the MRI apparatus, and a gradient magnetic field power source 10 for driving the gradient magnetic field coils respectively for the three gradient magnetic fields. The gradient magnetic field power source 10 selectively supplies a drive current to the gradient magnetic field coils in the X, Y, and Z directions, in accordance with an instruction from the sequencer 4 to be described later, thereby applying at least one of the gradient magnetic fields Gx, Gy, and Gz. For example, at the time of imaging, a slice plane (imaging section) for the subject 1 is set by applying a slice-direction gradient magnetic field pulse (Gs) in a direction perpendicular to the slice plane, and a gradient magnetic field pulse in the phase encoding direction (Gp) and a gradient magnetic field pulse in the frequency encoding direction (Gf), perpendicular to each other, are respectively applied to the remaining two directions perpendicular to the slice plane, thereby encoding the position information of each direction in an echo signal.

The transmission system 5 comprises a high-frequency oscillator 11, a modulator 12, an RF amplifier 13, and a transmit-side RF coil (transmit coil) 14a, and the subject 1 is irradiated with an RF magnetic field pulse (hereinafter, referred to as "RF pulse") so as to cause nuclear magnetic resonance in nuclear spins of atoms constituting biological tissue of the subject 1. Specifically, the RF pulse outputted from the high-frequency oscillator 11 is amplitude-modulated by the modulator 12 at the timing according to a command from the sequencer 4, and the amplitude-modulated RF pulse is amplified by the RF amplifier 13. Then, the RF pulse is supplied to the RF coil 14a disposed in proximity to the subject 1, and the subject 1 is irradiated with the RF pulse. Then, nuclear magnetic resonance occurs in the nuclear spins of the tissue of the subject 1, and an echo signal (NMR signal) is emitted.

The receiving system 6 comprises a receiving-side RF coil (receiver coil) 14b, a signal amplifier 15, a quadrature phase detector 16, and an A/D converter 17, and detects the echo signal (NMR signal) emitted from the subject 1. Specifically, the receiver coil 14b is disposed in proximity to the subject 1, receives the echo signal emitted from the subject 1, and converts the echo signal into an electrical signal. The signal amplifier 15 amplifies the echo signal, and the quadrature phase detector 16 divides the echo signal into dual orthogonal signals at a timing according to a command from the sequencer 4. Each of the dual signals is converted into a digital amount by the A/D converter 17, and sent to the signal processing system 7.

The signal processing system 7 includes an optical disk 19, a magnetic disk 18, a storage device such as an ROM 21 and an RAM 22, and a display 20 comprising CRT, or the like. The CPU 8 constitutes a part of the signal processing system 7, reads and executes a program stored in advance in the optical disk 19 and other storage device, thereby implementing functions such as a subject positioning unit 81 configured to perform automatic positioning of the subject 1 in the imaging space 40, an image reconstruction unit 82 configured to perform image reconstruction, and a data processing unit (not shown) configured to perform various data processing.

Specifically, the subject positioning unit 81 automatically performs positioning of an imaging target site of the subject 1 placed on the table 30, to be aligned with the center of the imaging space 40 (the static magnetic field center).

In the image reconstruction unit 82, when the data from the receiving system 6 is inputted into the CPU 8, the CPU 8 executes processing such as signal processing and image reconstruction, and a tomographic image of the subject 1 as a result of the processing is displayed on the display 20, and recorded in an external storage device such as the magnetic disk 18.

The sequencer 4 is a control means for executing a pulse sequence for the transmission system 6 to deliver and apply RF pulses and for the gradient magnetic field generating system 3 to deliver and apply gradient magnetic field pulses, at predetermined timing respectively, and for the receiving system 6 to detect an echo signal from the subject 1 at a predetermined timing. The sequencer 4 operates under the control of the CPU 8, and sends a command to cause each unit to execute the pulse sequence, thereby collecting data (echo signals) required for reconstructing a tomographic image of the subject 1.

An operation unit 25 is configured to input various control information of the MRI apparatus, and control information of the processing performed by the aforementioned signal processing system 7. The operation unit includes a trackball or mouse 23, and a keyboard 24. The operation unit 25 is disposed in proximity to the display 20, and configured to allow an operator to control various processes of the MRI apparatus interactively through the operation unit 25, while viewing the display 20.

An imaging object nuclide of the MRI apparatus, widely used clinically, is hydrogen atom nucleus (proton) which is a main constituent material of the subject. By imaging information regarding a spatial distribution of proton density and a spatial distribution of relaxation time in the excited state, forms or functions of a human head, abdominal region, limb, and so on, are imaged two-dimensionally or three-dimensionally.

It should be noted that the operator provides the receiver coil 14b described above, in a manner to face or surround the imaging target site of the subject 1.

According to the following first to fourth embodiments, there will now be described processing for the subject positioning unit 81 to perform automatic positioning of the imaging target site of the subject 1 placed on the table 30, to be aligned with the center of the imaging space 40 (static magnetic field center).

First Embodiment

With reference to the flowchart of FIG. 2, the processing of the subject positioning unit 81 according to the first embodiment of the present invention will be described.
(Step 101)

Through the operation unit 25, the operator enters the subject information, and the subject positioning unit 81 accepts thus entered subject information. As the subject information, "imaging target site", "body posture", "gender", and "age" shall be required entries. FIG. 4 illustrates an example of a display screen showing various imaging target sites, which are selectable. The operator selects the imaging target site on the display screen of FIG. 4, and this allows an input of the imaging target site. The display screen of FIG. 4 may also be configured to display recommended types of the receiver coil 14b, depending on the imaging target site being selected.
(Step 102)

Figure 5:
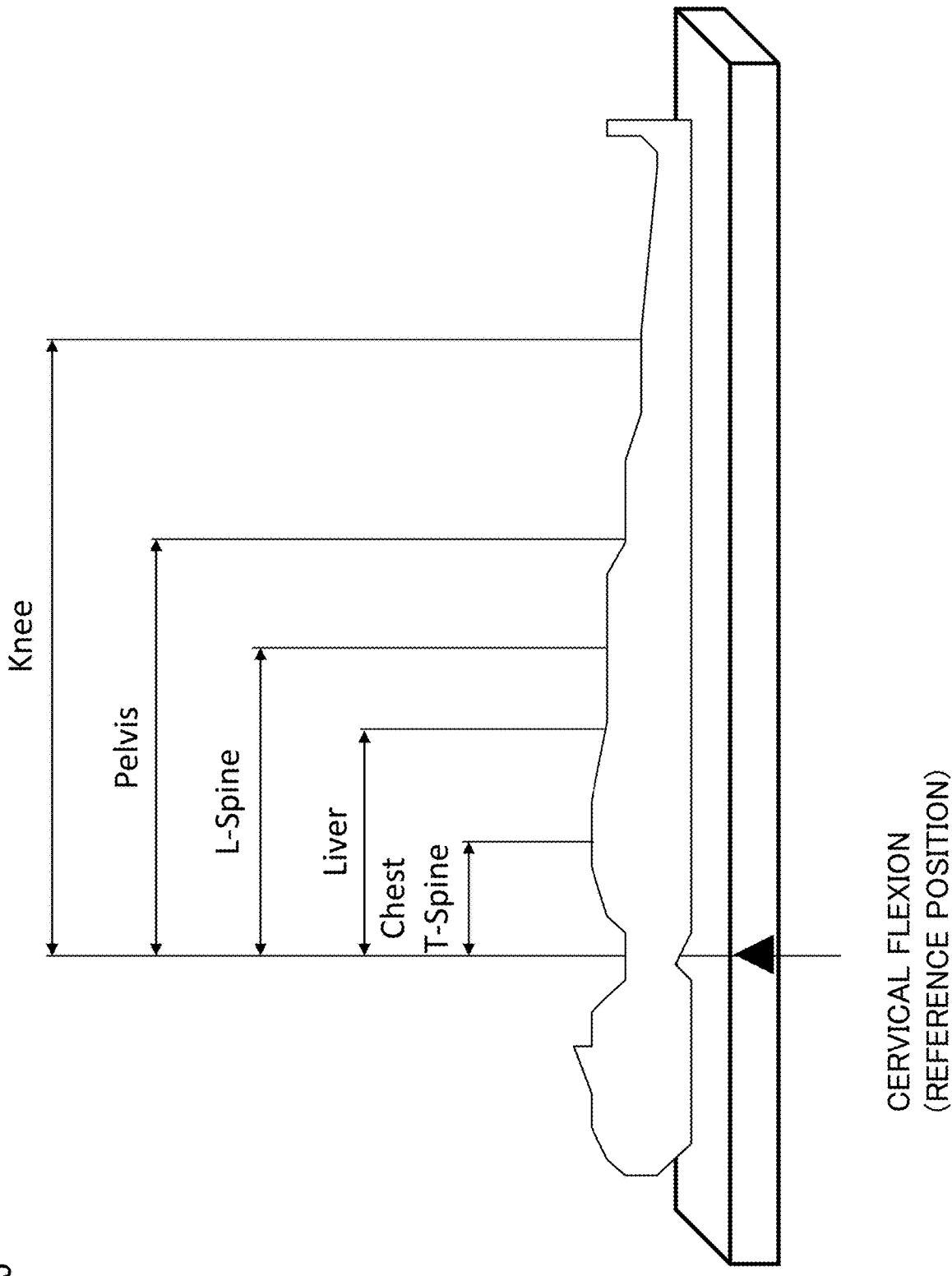
FIG. 5 illustrates distance from a reference position of a human body to target examination sites according to the first embodiment.

As shown in FIG. 5, the operator places the subject 1 on the table 30, in a manner to align a human body reference position of the subject 1 (e.g., a cervical flexion) with a predetermined position of the table 30 (the position indicated by the arrow that is a mark provided on the table 30).

Figures 6A, 6B:
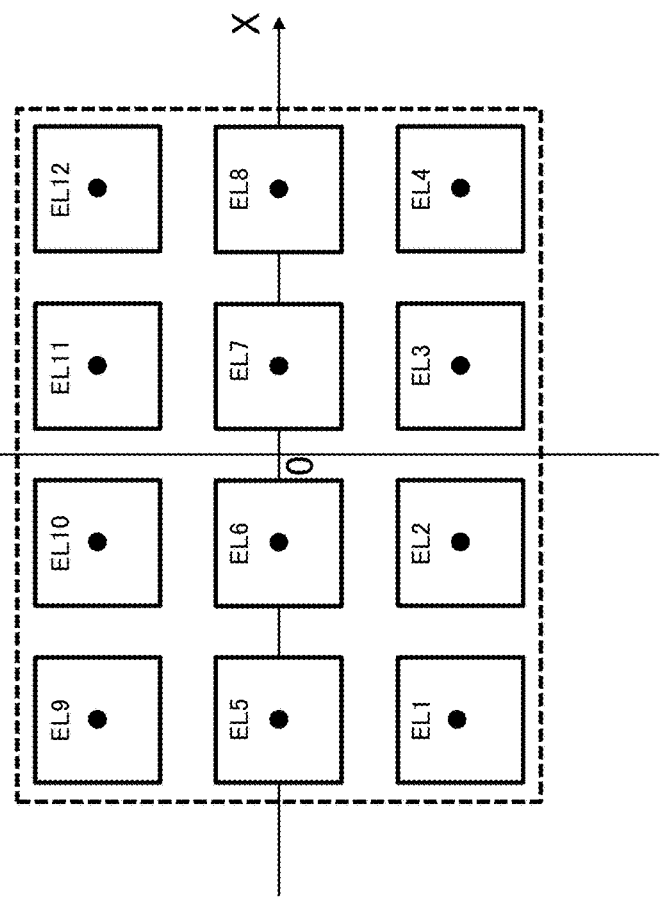
FIG. 6A illustrates an arrangement of elements and FIG. 6B is a table showing relative positions of elements of an array-type receiver coil according to the first embodiment.

Furthermore, the operator provides the receiver coil 14b at the imaging target site of the subject 1. Then, a cable of the receiver coil 14b is connected to a connector provided in the table 30, thereby establish connection with the signal amplifier 15. Here, as an example, as shown in FIG. 6A, an array coil is used as the receiver coil 14b, in which a plurality of coils is arranged in the HF (Head Foot) direction of the subject 1 (body axis direction). The receiver coil 14b of FIG. 6A includes a plurality of coils being arranged also in the width direction of the subject 1.

Thereafter, when the operator presses a start button for moving the table, the subject positioning unit 81 accepts this action and proceeds to step 103.

(Steps 103 and 104)

In step 103, the subject positioning unit 81 determines whether the "height" of the subject information is not entered in step 101, and if not entered, the process proceeds to step 104. Then, based on the information of the "gender" and the "age" entered in step 101, the height is estimated with reference to a table showing the relationship between gender, age, and height. For example, as shown in FIG. 7, the table showing the relationship between gender, age, and height is prepared in advance based on the age-specific statistical height data, which is stored in the storage device such as the ROM 21.

It is also possible to improve precision of the height estimation in step 104, by using height data categorized by age and race.

In step 103, the process of the subject positioning unit 81 proceeds directly to step 105 when the "height" of the subject information is already entered in step 101.

(Step 105)

In step 105, the subject positioning unit 81 calculates, on the basis of the imaging target site and the height, an amount of table movement to place the imaging target site in the static magnetic field center.

First, the subject positioning unit 81 refers to a predetermined table such as the table as shown in FIG. 8, on the basis of the imaging target site and the height received in step 101, and obtains distance from the cervical flexion to the imaging target site. The table of FIG. 8 shows predetermined distance from the cervical flexion to each of the imaging target sites as shown in FIG. 5, based on the height-specific statistical data, etc., categorized by height, and the data is stored in the storage device such as the ROM 21.

When the center of the static magnetic field is assumed as the origin, the position of the imaging target site on the table (target table position) may be expressed by Equation 1:

Equation 1

$$\text{TargetTablePosition} = \text{DefaultTablePosition} + \text{ShiftPosition} \quad (1)$$

In here, TargetTablePosition indicates the target table position, DefaultTablePosition indicates the table position of the cervical flexion, and ShiftPosition indicates the distance from the cervical flexion to the imaging target site being entered.

The subject positioning unit 81 calculates the position (target table position) of the imaging target site, using the obtained distance from the cervical flexion to the imaging target site, the current table position of the cervical flexion, and Equation 1. Thus, it is possible to calculate the amount of table movement for moving the position of the imaging target site (target table position) to the center of the static magnetic field (the origin).

Then, the subject positioning unit 81 moves the table 30 only by the calculated amount of table movement, thereby placing the imaging target site in the center of the static magnetic field.

(Step 106)

When the CPU 8 (the subject positioning unit 81) recognizes that a condition for RF pulse irradiation is satisfied (for example, a certain waiting time has elapsed after closing a door of a shield room where the MRI apparatus is disposed), the CPU 8 (the subject positioning unit 81) starts the sequencer 4 to execute a predetermined pulse sequence for positioning the receiver coil 14b according to the control of the sequencer 4.

Figure 9A:
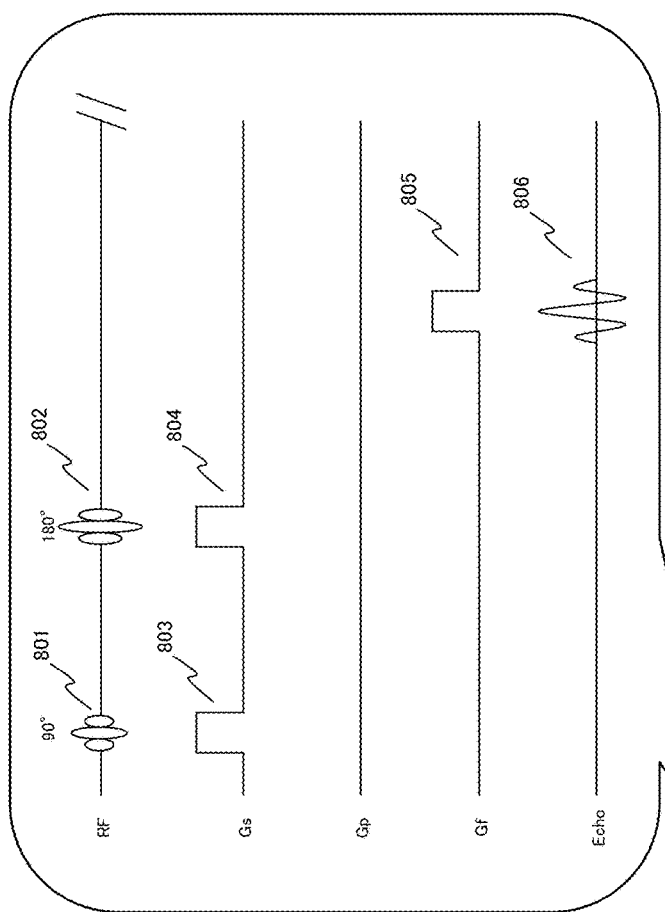
FIG. 9A shows a pulse sequence used for the subject positioning in the first, second, third, and fourth embodiments.
Figure 9B:
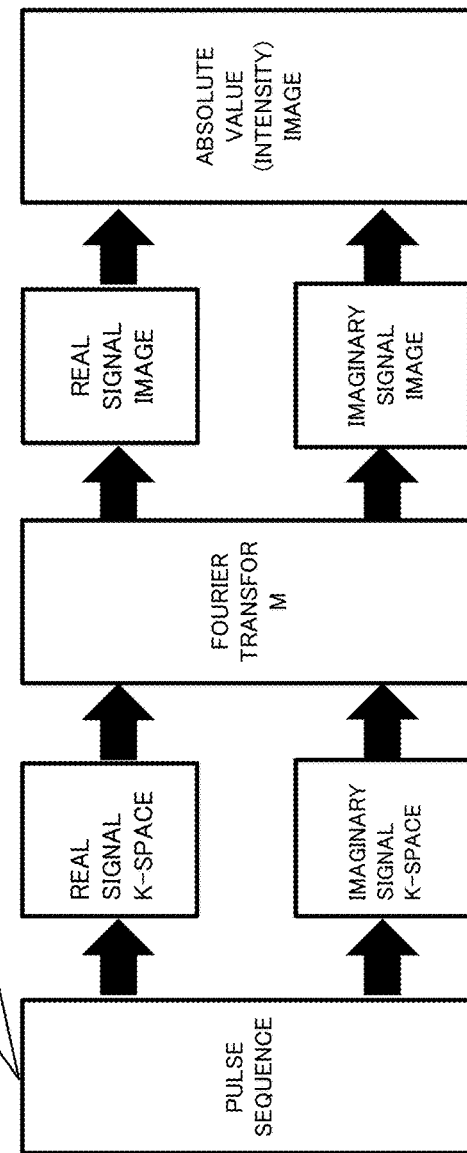
FIG. 9B shows a flow diagram showing the processing of an NMR signal being acquired.

FIG. 9A illustrates the pulse sequence, and FIG. 9B illustrates a series of processing after a NMR signal is received according to the pulse sequence.

As shown in FIG. 9A, in the pulse sequence for performing the positioning, a slice (a sagittal or coronal plane) including the HF direction (body axis direction) of the subject 1 is selected to excite the spins, and the emitted NMR signal is received by the receiver coil 14b, assuming the HF direction as the reading direction.

Specifically, the RF pulses 801 and 802 are provided to excite the spins, while applying slice selective gradient magnetic field pulses 803 and 804 for selecting the slice including the HF direction (body axis direction). Then, while applying a frequency-encoded gradient magnetic field pulse 805 in the HF direction, echo signals 806 are received respectively by the individual elements of the array coil being the receiver coil 14b (assuming the HF direction as the readout direction).

The receiving system 6 sends the NMR signals respectively received by the individual elements constituting the receiver coil 14b, to the signal processing system 7.

As shown in FIG. 9B, the subject positioning unit 81 of the signal processing system 7 separates the NMR signals (signals in k-space) received by the individual array coils, into real signals and imaginary signals, and each of the signals is subjected to Fourier transform to generate a real signal image and an imaginary signal image. Then, by summing both images, a absolute value (intensity) image for each element of the array coil is generated.

(Step 107)

The subject positioning unit 81 identifies from the "imaging target site", the element of the receiver coil 14b to be disposed in the static magnetic field center. For example, in the example of the receiver coil of FIG. 6A, any of the center elements EL5 to EL8 in the HF-direction is assumed as the element to be placed in the center of the static magnetic field. It should be noted in the example of the receiver coil of FIG. 6A, the elements are also aligned in the left-right direction of the subject. Thus, the center element EL6 or EL7 being the closest to the HF direction (body axis) is preferably assumed as the element in the center of the static magnetic field. Here, as shown in FIG. 10A, EL6 is placed in the center of the static magnetic field with respect to the HF direction (body axis).

In order to define the center element in the HF direction of the receiver coil, relative position information of each element is predefined based on the center position of the receiver coil, as to each of the receiver coils as shown in FIG. 6B and the relative position information is stored in the storage device such as the ROM 21.

(Step 108)

In step 108, the subject positioning unit 81 calculates the center position of the center elements EL5 to EL8 (in the example here, the center element is EL6) in the HF direction, from the signal intensity data of the absolute value (intensity) image obtained in step 106 for each element of the receiver coil 14b.

Figure 2:
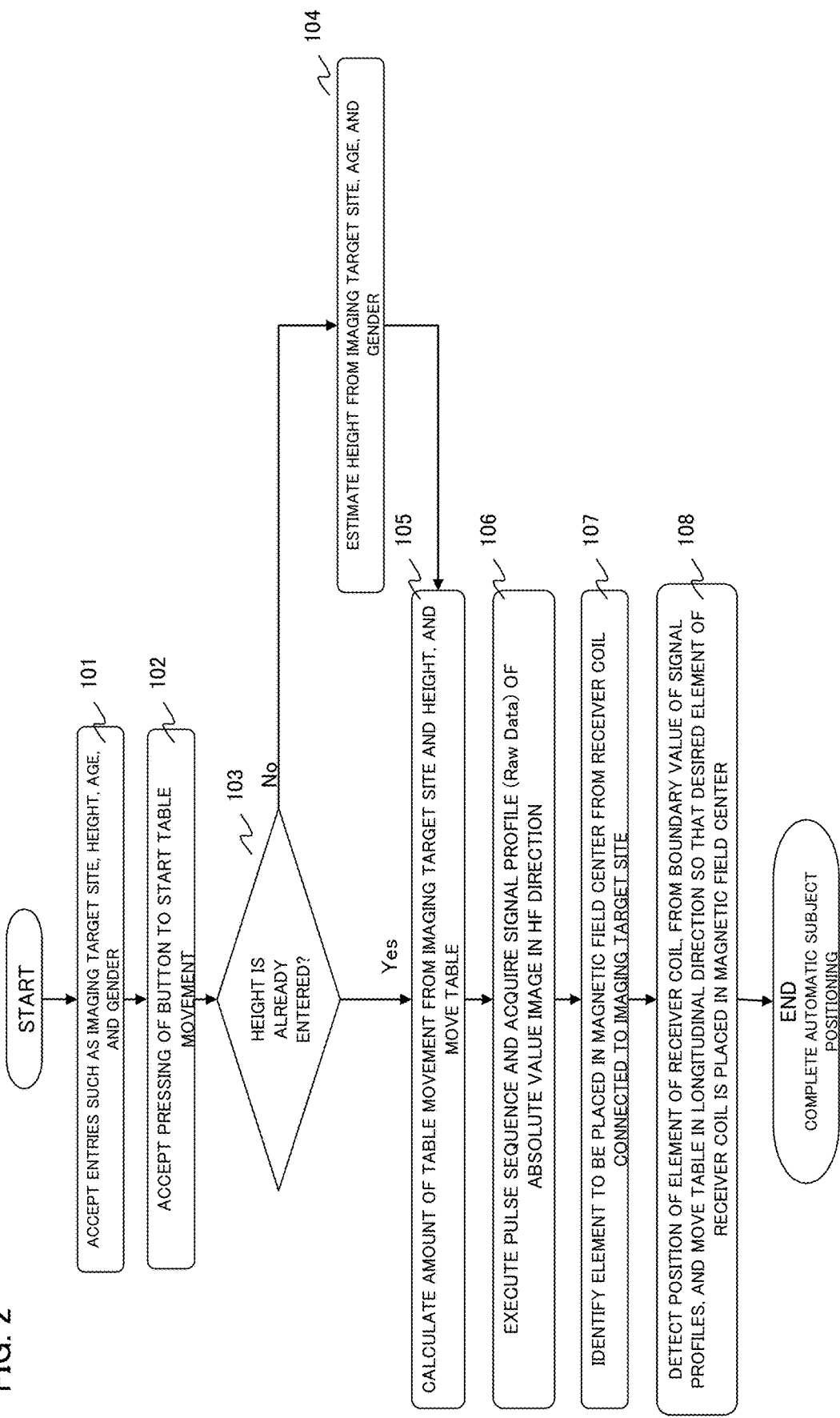
FIG. 2 is a flowchart showing a processing of a subject positioning unit 81 of the first embodiment.
Figures 2, 10B:
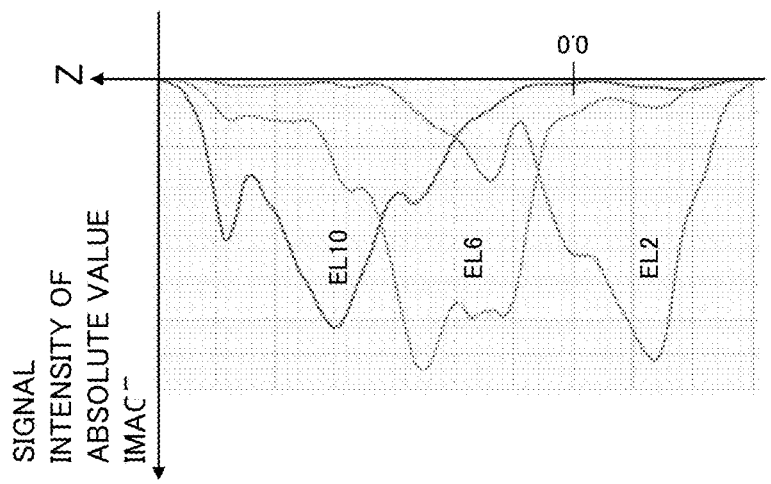
Figures 1, 10B:
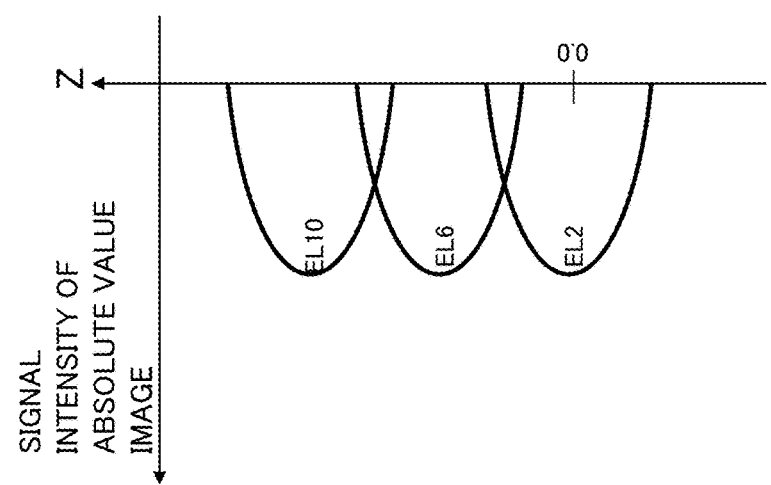
Figure 10A:
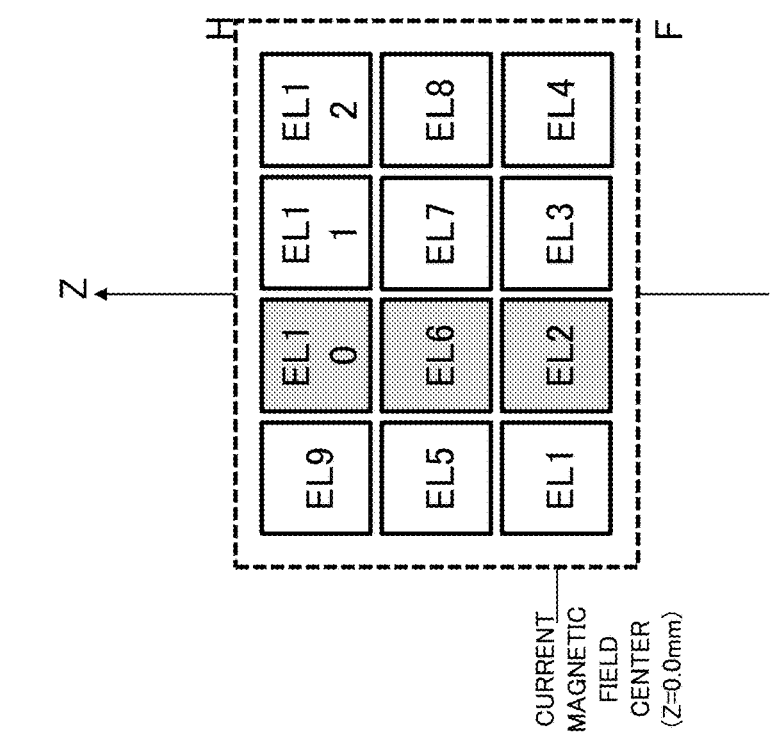
FIG. 10A illustrates the arrangement of elements of the array-type receiver coil according to the first embodiment.

Specifically, a signal intensity profile of the absolute value (intensity) image for each element is created, for the row of the elements (EL2, EL6, and EL10) aligned in the Z-axis (HF) direction as shown in FIGS. 10B-1 and 10B-2, and the center position of the element EL6 in the HF direction is calculated from these profiles.

Figure 11B:
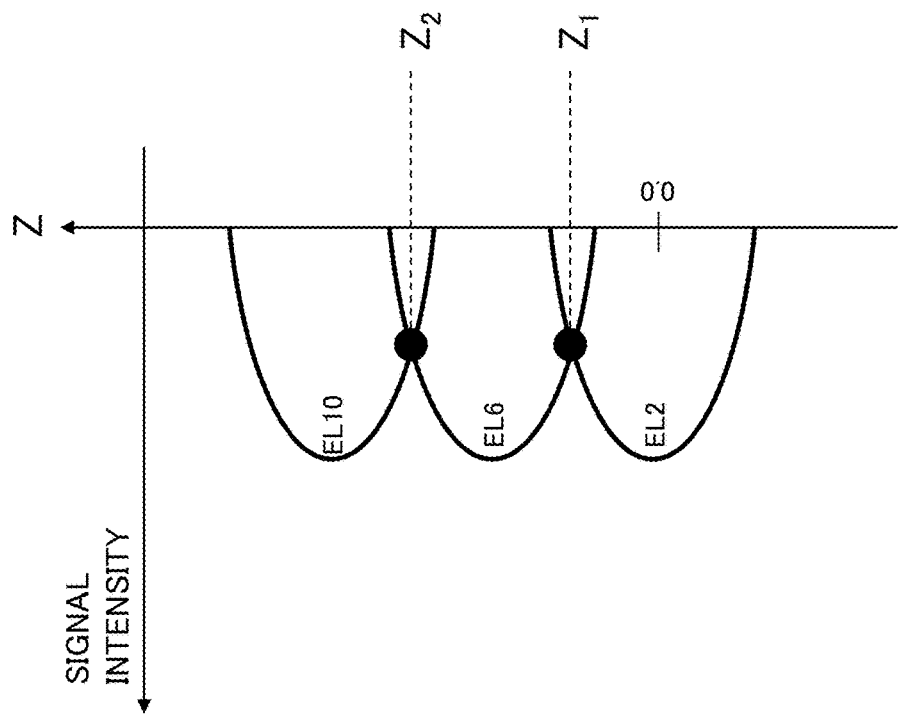
FIG. 11B illustrates that boundary positions between the elements are determined from the profiles of the signal intensity of the absolute value images obtained using the receiver coil of FIG. 11A.
Figure 11A:
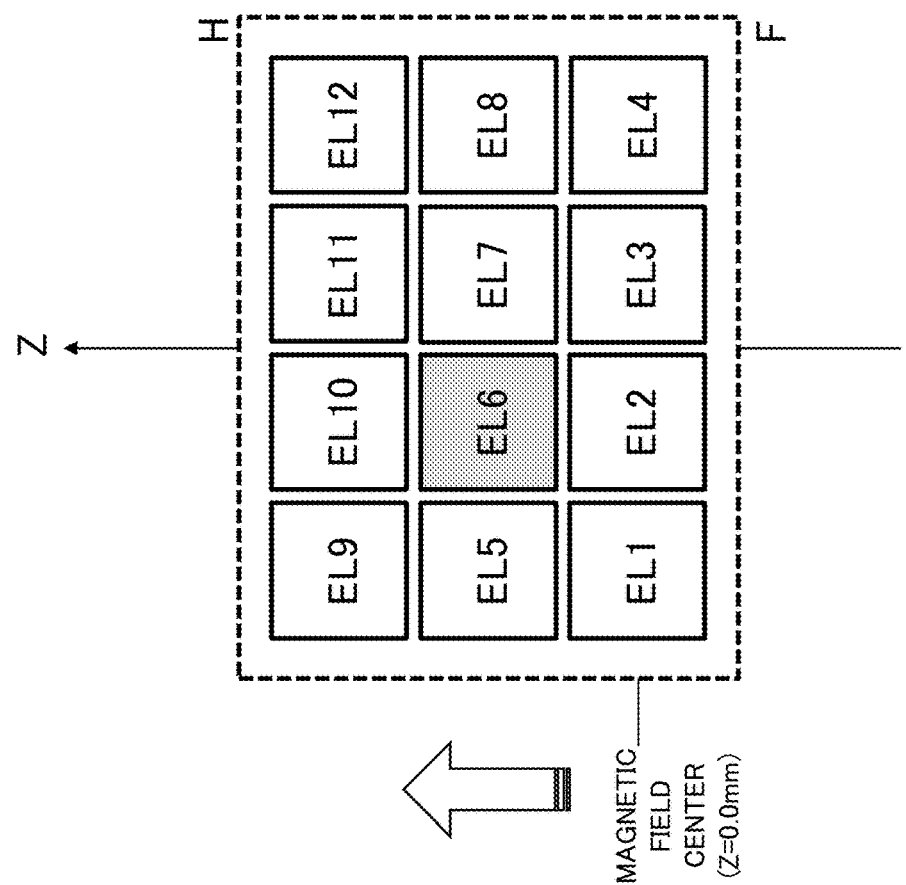
FIG. 11A illustrates the arrangement of the elements of the array-type receiver coil according to the first embodiment with indicating the element at the center.

On this occasion, if the subject 1 has neither a uniform shape nor the same composition, such as a human body, the signal intensity profiles as shown in FIG. 10B-2 are obtained, not an ideal signal intensity profiles as shown in FIG. 10B-1. Therefore, it is difficult to calculate the center position of the element EL6 from the peak position of the signal intensity profile. Therefore, in the present embodiment, on the basis of the signal intensity profile of the absolute value image being created for each element, signals of the adjacent elements (EL2, EL6, and EL10) in the HF direction are compared, and as shown in FIGS. 11A and 11B, the positions $Z_1$ and $Z_2$ in the HF direction (Z direction) are obtained where the values of the signal intensity profiles become equal between the elements (i.e., the points where the profiles intersect). Thus, it is possible to detect boundary positions between the elements (positions $Z_1$ and $Z_2$).

It should be noted that the Z-axis direction is the same direction as the static magnetic field, and it corresponds to the longitudinal direction of the table.

When the element arrangement as shown in FIG. 11A is taken as an example, the position Z where the values of the signal intensity profiles become equal is expressed by Equation 2:

Equation 2

$$EL2\ \text{Signal}(i) = EL6\ \text{Signal}(i), EL6\ \text{Signal}(j) = EL10\ \text{Signal}(j) \quad (2)$$

where $i \ne j$

The center position CorrectionPosition of the element EL6 is calculated by Equation 3, using the boundary positions (positions $Z_1$ and $Z_2$) between the elements.

Equation 3

$$\text{CorrectionPosition} = (Z_2 + Z_1)/2 \quad (3)$$

where $Z_1$ and $Z_2$ indicate the coordinate positions of two points corresponding to the boundary positions in the Z direction.

The center position of the element EL6 obtained by Equation 3 indicates a center value of the coordinate positions of the two points (positions $Z_1$ and $Z_2$) corresponding to the boundary positions, and the center position also represents the distance from the center of the static magnetic field (Z=0.0). Therefore, the subject positioning unit 81 moves the table 30 using this value as the amount of table movement, thereby allowing the center of the element EL6 of the receiver coil 14b to be placed at the center of the static magnetic field with respect to the Z-axis direction.

As thus described, the receiver coil 14b can be placed in the static magnetic field center with respect to the HF direction, the receiver coil being provided at the imaging target site by the operator, and the receiver coil 14b and the imaging target site can be automatically arranged within the imaging space 40. Therefore, it is possible to take an image of the entire imaging target site.

Further, in the present embodiment, without using an additional sensor, a distance from the reference position of the human body to the imaging target site is determined based on the entered subject information. Then, a position to which the table should be moved is approximately determined, and the table is moved to the position. Thereafter, a readout direction is set to the HF direction, and the signal intensity profile of the absolute value image for each element in the Z-axis (HF) direction is obtained from the NMR signal, which is acquired by applying the slice selective gradient magnetic field and the frequency encoding gradient magnetic field. The boundary between the elements can be detected, and thus the center position of the elements can be obtained from the boundary positions. It is possible to treat the center position of the elements as the distance from the center of the static magnetic field, and then move the table using the calculated center value as the amount of table movement, allowing a desired element to be placed in the center of the static magnetic field.

Figure 3:
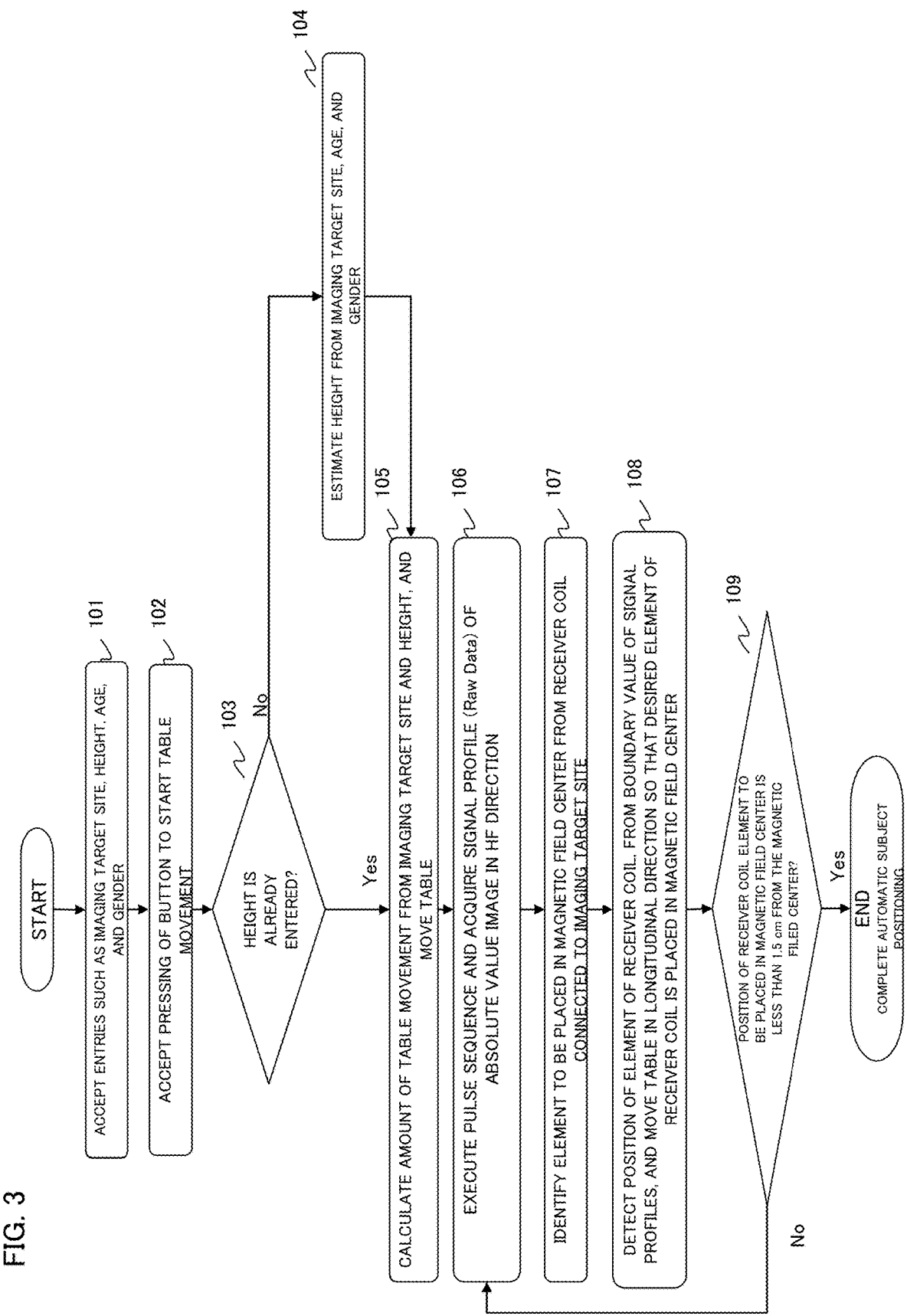
FIG. 3 is a flowchart showing a modification of the processing of the subject positioning unit 81 of the first embodiment.

As shown in FIG. 3, in order to place a desired element in the static magnetic field center with higher precision, the subject positioning unit 81 may execute step 109 after moving the table 30 so that the center of the elements of the desired receiver coil 14b is placed in the static magnetic field center according to the aforementioned steps 101 to 108. In step 109, the subject positioning unit 81 determines whether or not the position of the desired element of the receiver coil 14b is disposed in a predetermined range (e.g., within a range of less than 1.5 cm) from the static magnetic field center. If the position of the element of the receiver coil 14b is disposed within the predetermined range from the static magnetic field center, the automatic positioning of the subject is completed. If it is not disposed within the predetermined range, the process returns to step 106 to perform the automatic positioning of the subject again.

In the first embodiment, the cervical flexion is assumed as the reference position of the human body, and the description has been made so far using the table provided with the mark indicating the reference position for setting the cervical flexion. However, it is of course possible to use another portion of the human body as the reference position.

There may be following effects produced by the MRI apparatus of the first embodiment:
1. A burden on the user (the operator of the MRI apparatus), caused by the works in setting the table position, can be reduced;
2. No laser is used, unlike a conventional art, and a risk that the laser may enter the eye can be avoided;
3. A discomfort given to the subject can be reduced, caused by table movement during the laser positioning in the conventional art;
4. A sensitivity region of a desired receiver coil can be automatically moved to the center of the static magnetic field; and
5. Unnecessity of additional hardware can reduce manufacturing cost.

Second Embodiment

Figure 12:
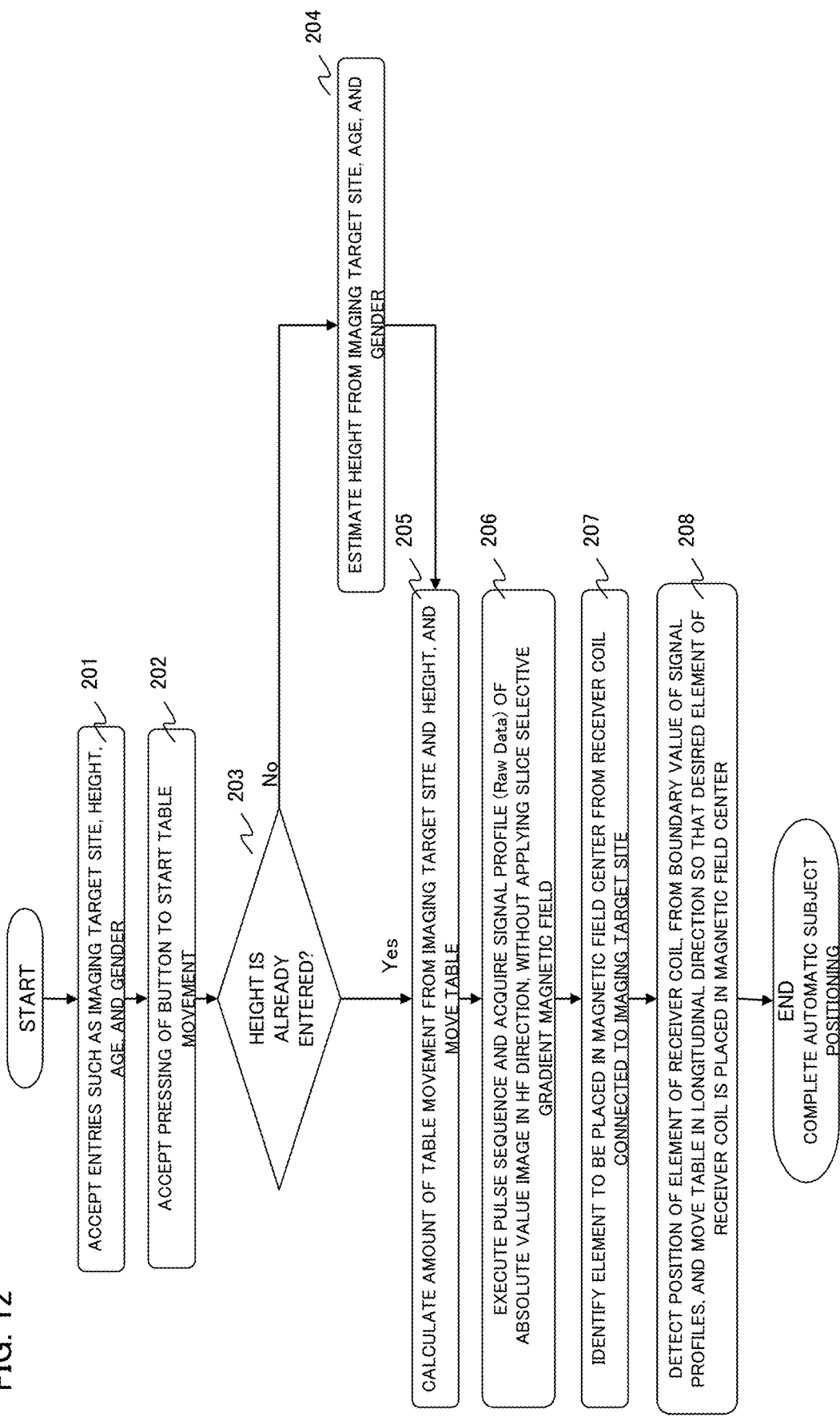
FIG. 12 is a flowchart showing the processing of the subject positioning unit 81 according to the second embodiment.

Next, with reference to the flowchart of FIG. 12, there will be described a process of the subject positioning unit 81 according to the second embodiment of the present invention.

In the second embodiment, there will be described the case where the number of elements of the receiver coil 14b is one. Hereinafter, only the processing different from that of the first embodiment will be described and the same processing will not be described redundantly.

(Steps 201 to 205)

Since the steps 201 to 205 are the same as steps 101 to 105 of the first embodiment, no redundant description will be provided.

(Step 206)

When the CPU 8 (the subject positioning unit 81) recognizes that the condition for RF pulse irradiation is satisfied (for example, a certain waiting time has elapsed after closing the door of the shield room), the CPU 8 (the subject positioning unit 81) starts the sequencer 4 to execute the predetermined pulse sequence for positioning the receiver coil 14b according to the control of the sequencer 4.

This pulse sequence is similar to the pulse sequence of FIG. 9A according to the first embodiment, but the sequencer 4 does not apply the slice selective gradient fields 803 and 804, and the echo signal 806 is received by one element of the receiver coil 14b while applying the frequency encoding gradient field 805 (the readout direction is the HF direction).

The processing after receiving the echo signal is similar to that of step 106 according to the first embodiment, and the absolute value image is generated for one element constituting the receiver coil 14b.

(Step 207)

The subject positioning unit 81 specifies the element to be disposed in the center of the static magnetic field, from the "imaging target site". For example, as shown in FIG. 4, a recommended receiver coil is presented to the operator depending on the imaging target site, and setting is performed so that the element of the presented recommended receiver coil is placed in the center of the static magnetic field.

(Step 208)

As shown in FIG. 13, the subject positioning unit 81 creates the signal intensity profile of the absolute value image with respect to the Z-axis (HF) direction, from the absolute value image of one element of the receiver coil 14b generated in step 206 (here, the Z-axis direction is the same direction as the static magnetic field and corresponds to the longitudinal direction of the table).

Next, as shown in FIG. 14, the subject positioning unit 81 calculates the center of gravity $Z_G$ in the Z-direction, on the basis of the created signal intensity profile of the element. Referring to the element arrangement of FIGS. 13 and 14, as an example, the center of gravity $Z_G$ can be calculated by Equation 4.

Equation 4

$$Z_G = \Sigma(S_i \times Z_i)/\Sigma S_i \quad (4)$$

When the static magnetic field center position is Z=0.0, the coordinate position of the center of gravity $Z_G$ represents the distance from the center of the static magnetic field. Thus the subject positioning unit 81 moves the table 30, assuming the coordinate of the calculated center of gravity $Z_G$ as the amount of table movement, whereby the center of gravity $Z_G$ of the element can be placed in the center of static magnetic field.

According to the second embodiment, even if the receiver coil 14b comprises only one element, it is possible to automatically place the center of gravity of the element in the center of static magnetic field.

Third Embodiment

Figure 15:
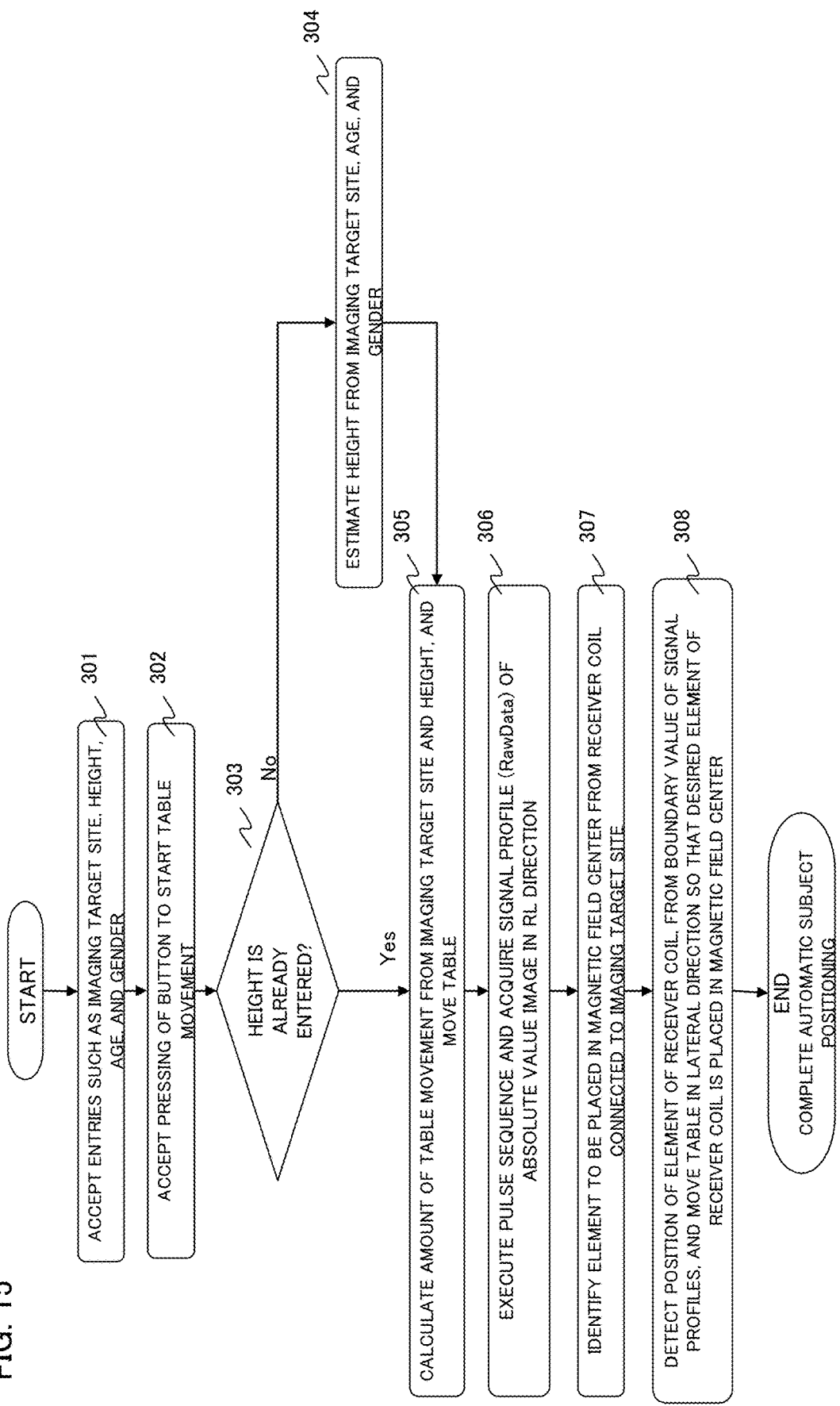
FIG. 15 is a flowchart showing the processing of the subject positioning unit 81 according to the third embodiment.

With reference to the flow of FIG. 15, there will now be described the processing of the subject positioning unit 81 according to the third embodiment.

The processing of the third embodiment is the same as that of the first embodiment, but there is a different point that the table 30 is moved in the X direction (lateral direction=RL (body width) of the subject direction). Hereinafter, there will be described only the steps different from the first embodiment, and the same processing will not be redundantly described.

Also, it should be noted the MRI apparatus having a structure capable of moving the table 30 in the X direction is generally limited to a vertical-magnetic field type MRI apparatus.

(Steps 301 to 305)

Since steps 301 to 305 are the same as steps 101 to 105 of the first embodiment, redundant description thereof will not be given.

(Step 306)

When the CPU 8 (the subject positioning unit 81) recognizes that the condition for RF pulse irradiation is satisfied (for example, a certain waiting time has elapsed after closing the door of the shield room), the CPU 8 (the subject positioning unit 81) starts the sequencer 4 to execute the predetermined pulse sequence for positioning the receiver coil 14b according to the control of the sequencer 4. This pulse sequence is similar to the pulse sequence of FIG. 9A according to the first embodiment, but following points are different from the first embodiment; the slice is set along the RL direction of the subject 1 and the readout direction is also set in the RL direction. That is, while applying the slice selective gradient magnetic fields 803 and 804 for selecting a slice along the RL direction of the subject 1, the RF pulses 801 and 802 are provided, and while applying the frequency-encoded gradient magnetic field 805, the receiver coil 14b receives the echo signal 806 (the readout direction is the RL direction).

The processing after receiving the echo signal is similar to step 106 of the first embodiment, and the absolute value image is generated for each of the plurality of elements constituting the receiver coil 14b.

(Step 307)

The subject positioning unit 81 identifies the element to be disposed in the center of the static magnetic field from the "imaging target site". For example, as shown in FIG. 4, a recommended receiver coil is presented to the operator according to the imaging target site, and setting is performed so that the RL-direction center element EL6 (or EL7) of the presented recommended receiver coil is disposed in the center of the static magnetic field.

(Step 308)

Figure 16:
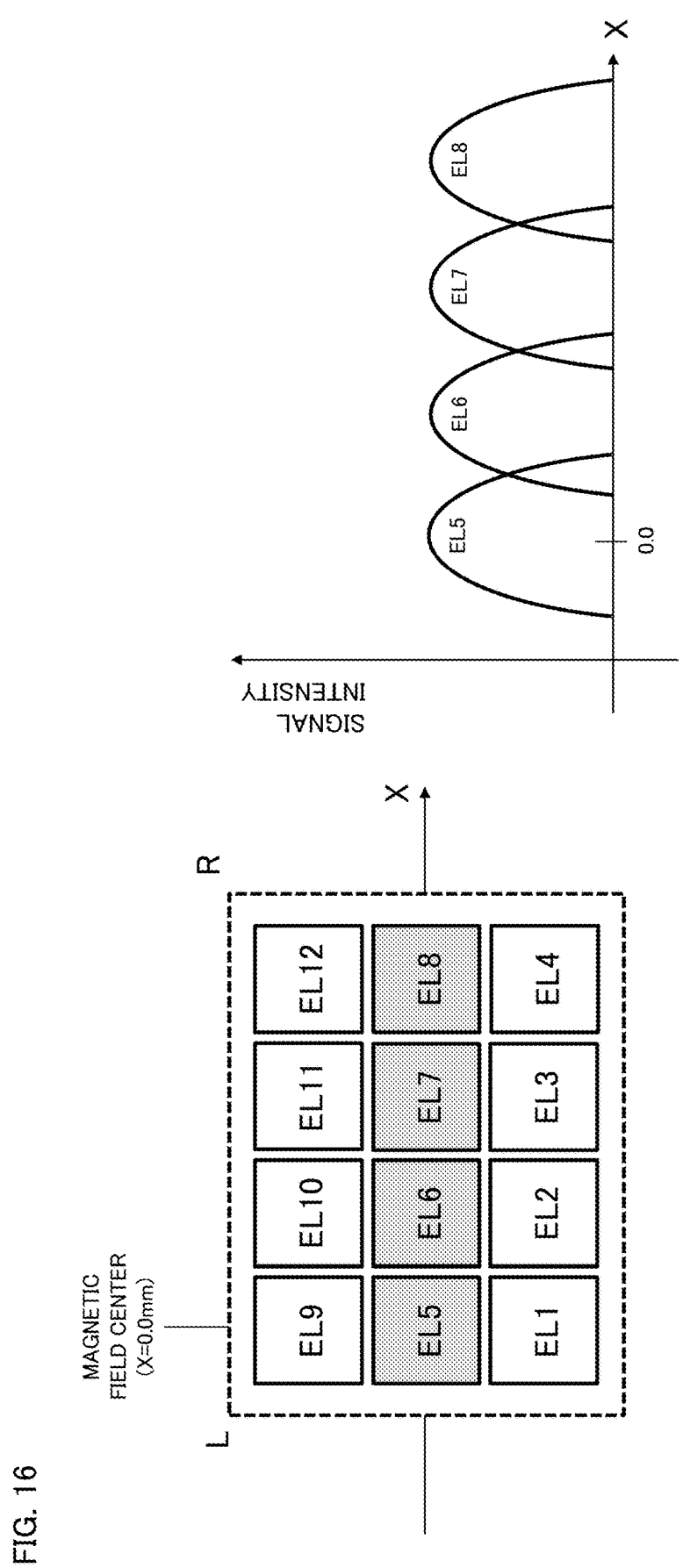
FIG. 16 illustrates a configuration of the array-type receiver coil according to the third embodiment, and X-axis direction profiles of the signal intensity of the absolute value image obtained from the NMR signals in the uniform phantom using the receiver coil.

As shown in FIG. 16, the subject positioning unit 81 creates the signal intensity profiles, from the absolute value images created with respect to the X-axis (RL) direction in step 306, for a plurality of elements EL5 to EL8 of the receiver coil 14b, which are aligned along the X-axis (RL) direction (here, the X-axis direction is perpendicular to the static magnetic field and corresponds to the lateral direction of the table).

On the basis of thus created signal intensity profiles respectively for the elements EL5 to EL8, the signal intensity of the elements EL5 to EL8 adjacent to each other in the RL direction is compared to determine a position in the X direction where the signal values become equal between the elements, and then, the boundaries $X_1$ and $X_2$ between the elements are detected.

Figure 17:
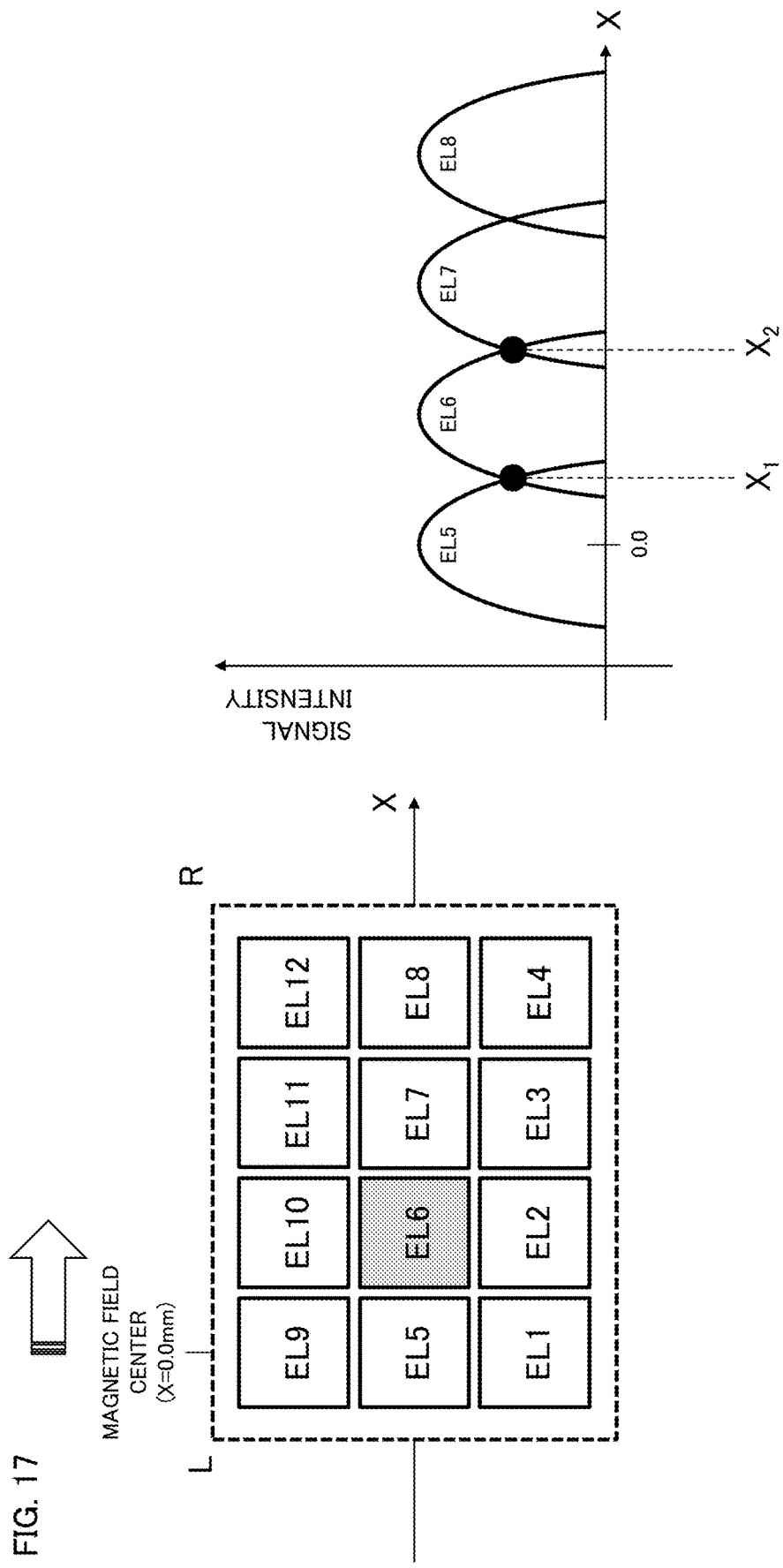
FIG. 17 illustrates the arrangement of the elements of the array-type receiver coil according to the third embodiment, the element at the center, and the boundary positions between the elements determined from the profiles of the signal intensity of the obtained absolute value images.

When the element arrangement as shown in FIG. 17 is taken as an example, the positions in the X-direction where the signal values become equal between the elements, are expressed by Equation 5:

Equation 5

$$EL5\ \text{Signal}(i)=EL6\ \text{Signal}(i), EL6\ \text{Signal}(j)=EL7\ \text{Signal}(j) \quad (5)$$

where $i \neq j$

The center position CorrectionPosition of the element EL6 can be calculated by Equation 6, using the boundary positions (positions $X_1$ and $X_2$) between the elements.

Equation 6

$$\text{CorrectionPositoin}=(X_2+X_1)/2 \quad (6)$$

where $X_1$ and $X_2$ indicate the coordinate positions of two points corresponding to the boundary positions in the X direction.

The center position of the element EL6 obtained by Equation 6 is the center value of the coordinate positions of the two points (positions $X_1$, $X_2$) corresponding to the boundary positions, and represents the distance from the static magnetic field center (X=0.0). Therefore, the subject positioning unit 81 moves the table 30 assuming this value as the amount of table movement, thereby placing the element EL6 of the center of the receiver coil 14b in the center of the static magnetic field with respect to the X-axis direction as shown in FIG. 17.

The third embodiment as described above is directed to the processing for placing the element at the center of the receiver coil 14b, in the center of the static magnetic field center with respect to the X (RL) direction. Therefore, combining the process above with the process of placing the element at the center of the receiver coil 14b in the static magnetic field center with respect to the Z (HF) direction according to the first and the second embodiments, allows both the center in the X (RL) direction and the center in the Z (HF) direction of the receiver coil 14 to coincide with the static magnetic field center.

For example, the processing of the first and second embodiments are performed to calculate the amount of table movement in the Z direction and to move the table in the Z direction, and then the processing according to the third embodiment is performed to calculate the amount of table movement in the X direction and move the table in the X direction. This enables table control to perform positioning so that the center of the receiver coil arranged at the imaging target site of the subject is aligned with the center of the static magnetic field.

It is of course possible to perform the table control in the order where the table movement in the Z direction is performed after the table movement in the X direction.

Furthermore, when excitation is performed on the coronal plane, the amounts of table movement in the Z and X directions can be simultaneously calculated, and this allows efficient movement such as controlling the table movement both in the Z direction and in the X directions simultaneously.

Further, a slice cross-section and slice thickness to be excited may be optimized, depending on the imaging target site and the body posture, and this optimization is commonly applicable to the first, second and third embodiments. For example, in the case that the imaging target site is a distal end of extremities, for instance, there is a possibility that the object is not included in the imaging space 40, and thus the NMR signal may be acquired by full excitation without applying the slice selective gradient magnetic field.

Fourth Embodiment

Figure 18:
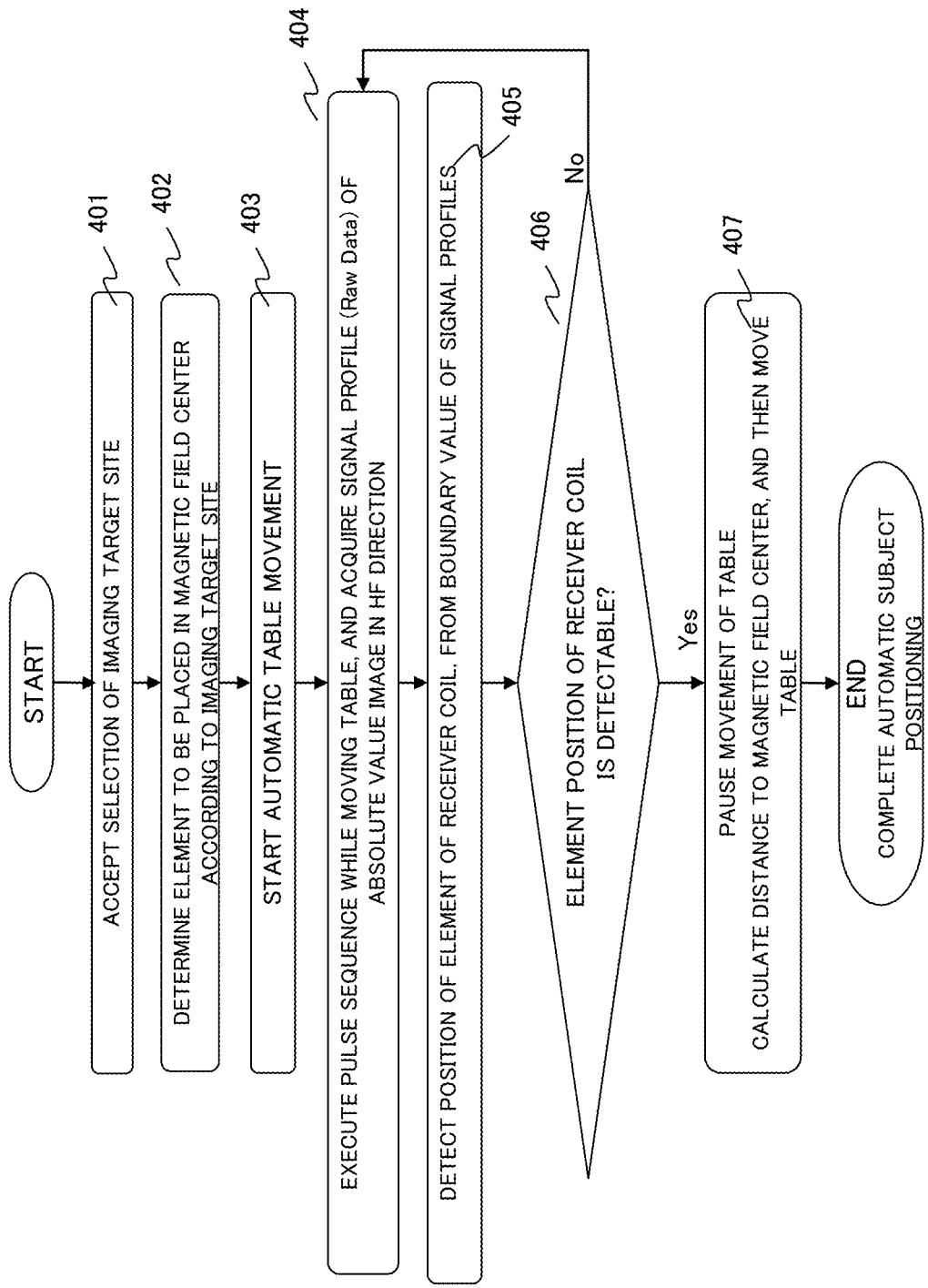
FIG. 18 is a flowchart showing the processing of the subject positioning unit 81 according to the fourth embodiment.
Figure 19:
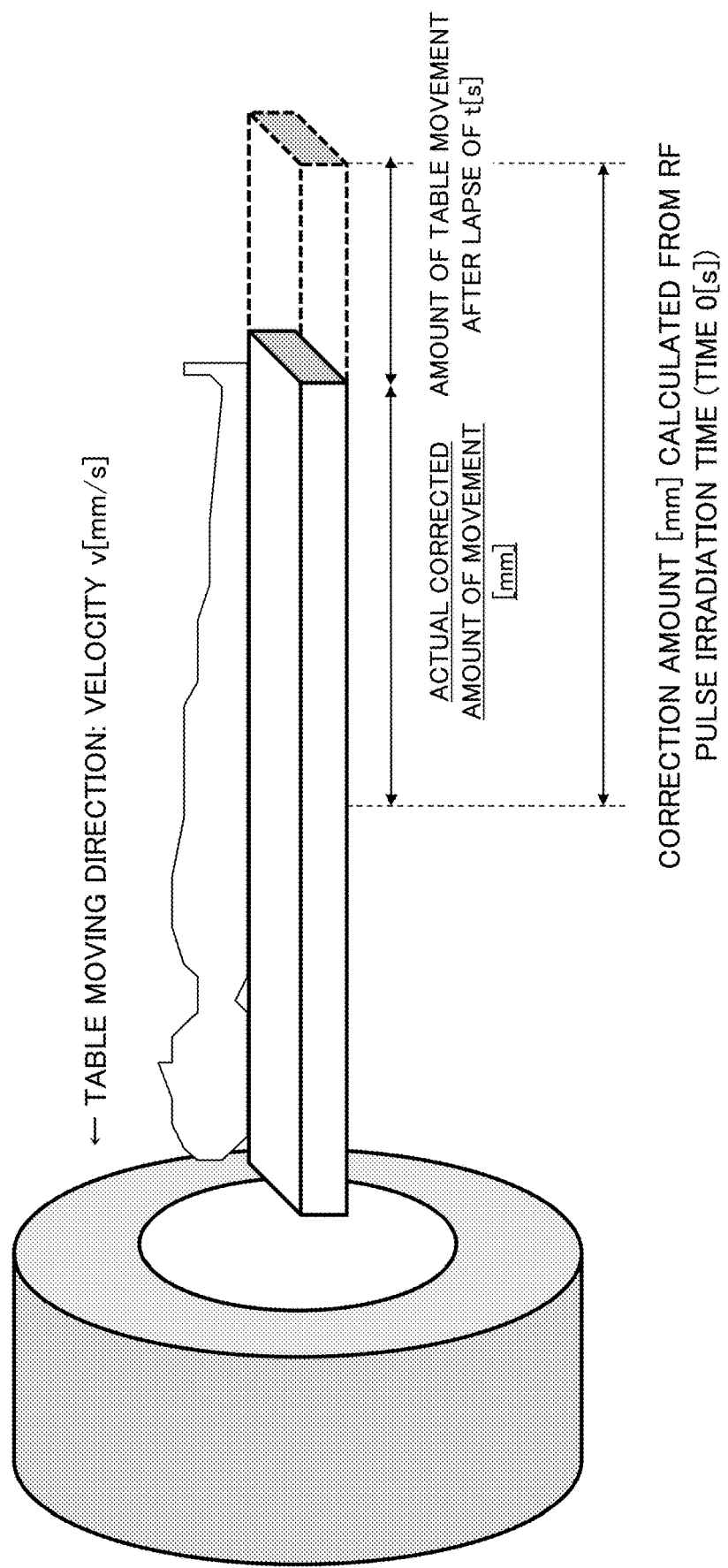
FIG. 19 illustrates movement of a table and an amount of actual corrected amount of movement according to the fourth embodiment.

With reference to FIGS. 18 and 19, there will now be described the fourth embodiment. In steps 101 to 105, steps 201 to 205, and steps 301 to 305, respectively, in the first, the second, and the third embodiments, the table is moved by a predetermined amount of table movement (a preset amount), referring to the predetermined table, or the like, based on the imaging target site and the height. However, in the fourth embodiment, these processes are not performed. In the fourth embodiment, the table 30 is moved in the HF direction at a constant rate and NMR signals are acquired at regular intervals to move the desired receiver coil element toward the center of the static magnetic field. With reference to the flowchart of FIG. 18, more specific description will be provided.

(Step 401)

The operator enters the subject information through the operation unit 25, and the subject positioning unit 81 accepts thus entered subject information. As the subject information, the "imaging target site" shall be a required field. FIG. 4 illustrates an example of the display screen showing various imaging target sites being selectable.

(Step 402)

The subject positioning unit 81 identifies an element of the receiver coil 14b to be disposed in the static magnetic field center, based on the "imaging target site". For example, in the example of the receiver coil shown in FIG. 6A, any of the center elements EL5 to EL8 in the HF-direction (e.g., EL6) is assumed as the element to be placed in the center of the static magnetic field.

(Step 403)

The operator lays the subject 1 on the table, and provides the receiver coil 14b at the imaging target site of the subject 1. Further, the cable of the receiver coil 14b is connected to the connector provided in the table 30, thereby establishing connection with the signal amplifier 15.

When the operator presses the start button for moving the table, the subject positioning unit 81 starts the sequencer 4, and according to the control of the sequencer 4, the table 30 starts moving toward inside the MRI apparatus. Moving speed is set to constant (e.g., represented by v [mm/s]), and the table is moved continuously (see FIG. 19).

(Step 404)

The subject positioning unit 81 executes the pulse sequence, similar to step 106 of the first embodiment, while the table 30 is moving at the constant speed, and all the elements of the receiver coil 14b receive the NMR signals (echo signals). The subject positioning unit 81 generates the absolute value image for each element of the receiver coil 14b, and generates the signal intensity profile of the absolute value image as shown in FIG. 10B-2.

(Steps 405 and 406)

The subject positioning unit 81 executes the first half of step 108 of the first embodiment, and detects the position of the element of the receiver coils 14b, from the boundary values $Z_1$ and $Z_2$ of the signal intensity profiles (step 405). In step 405, it is determined whether the position of the element of the receiver coil 14b has been detectable. If it has been detectable, the process proceeds to step 407. Determination whether or not the element position is detectable is made, for example, by comparing the signal intensity of the coordinates of two points that have become the boundary values $Z_1$ and $Z_2$ used for calculating the element position, with a predetermined threshold value, and when the signal intensity exceeds the threshold value, the element position is determined as detectable.

If it has been undetectable, the processing of the subject positioning unit 81 returns to step 404, and the pulse sequence is executed again.

(Step 407)

The subject positioning unit 81 pauses the movement of the table 30, and based on the position of the element EL6 of the receiver coil 14b detected in step 405, the distance to the static magnetic field center is calculated. At this time, the distance from the current position of the element to the center of the static magnetic field is calculated, considering that the table has moved continuously along with executing the pulse sequence in step 404. Specifically, assuming the timing of irradiation of the RF pulse 801 is set to time 0 [s] in the pulse sequence of FIG. 9A, for instance and the elapsed time is set to t [s] from the time when the receiver coil 14b receives the NMR signal until the subject positioning unit 81 executes analysis of the element position, the table 30 is moved by vt [mm] during the elapsed time t [s] (see FIG. 19). The position of the element (the center value of the boundary values $Z_1$ and $Z_2$) detected in step 405 is the position at time 0 [s]. Therefore, considering the amount of the table movement vt [mm] during the elapsed time t [s], the amount of table movement (actual corrected amount of movement) CorrectionPosition can be calculated by Equation 7, to align the element EL6 of the receiver coils 14b with the center of the static magnetic field (FIG. 19):

[Equation 7]

$$\text{CorrectionPosition}=(Z_2+Z_1)/2-vt \quad (7)$$

The subject positioning unit 81 moves the table 30 by the amount of table movement (actual corrected amount of movement) CorrectionPosition obtained by Equation 7, whereby the center of the element EL6 of the receiver coil 14b can be placed in the center of the static magnetic field with respect to the Z-axis direction.

As thus described, since the operator is allowed to place the receiver coil 14b provided at the imaging target site in the static magnetic field center with respect to the HF direction, the receiver coil 14b and the imaging target site can be automatically arranged within the imaging space 40. Therefore, this enables imaging of the entire imaging target site.

Further, in the fourth embodiment, unlike the processing of steps 101 to 105 of the embodiments including the first embodiment, there is no processing to move the table by the predetermined amount of table movement (preset amount) referring to the predetermined table or the like, it is advantageous in that a table such the reference table is not necessarily prepared in advance and the operator does not need to enter the height.

In addition, in the course of executing the pulse sequence, the table 30 continues moving toward the static magnetic field center, and thus the amount of moving the table in step 407 is small, allowing quick placing of the subject in the static magnetic field center.

There have been described the embodiments of the present invention, but it is not intended to restrict the present invention to the configuration and processing of those embodiments as described above.

What is claimed is:

1. A magnetic resonance imaging apparatus comprising:
   a static magnetic field generator configured to generate a static magnetic field in imaging space;
   a receiver coil having a plurality of individual elements configured to receive a nuclear magnetic resonance signal emitted from a subject;
   a table configured to place the subject thereon and to move the subject to the imaging space;
   a transmit coil configured to irradiate the subject placed in the imaging space with an RF magnetic field;
   a gradient magnetic field generator configured to apply a gradient magnetic field superimposing on the static magnetic field; and
   a subject positioning unit configured to control movement of the table to perform positioning for aligning an imaging target site of the subject with the imaging space,
   wherein the subject positioning unit:
   irradiates the subject in the imaging space with the RF magnetic field, and allows the individual elements of the receiver coil to receive the nuclear magnetic field signal emitted from the subject, and apply the gradient magnetic field in a predetermined direction, in accordance with a predetermined pulse sequence,
   separates the nuclear magnetic field signal signals received by the individual elements into real signals and imaginary signals,
   subjects each of the signals to a Fourier transform to generate a real signal image and an imaginary signal image,
   sums the generated real signal image and the generated imaginary signal image and obtain an absolute value image for each element of the receiver coil,
   calculates profiles of the signal intensity respectively for two or more of the elements among the plurality of elements based on the absolute value images,
   calculates the position of each of the two or more elements based on a position where the respective profiles of the signal intensities of the two or more elements intersect in the predetermined direction, and
   moves the table so that the position of the receiver coil is aligned with the imaging space based on the position of each of the two or more elements.

2. The magnetic resonance imaging apparatus according to claim 1,
   wherein the subject positioning unit:
   calculates profiles of the signal intensity respectively for two or more of the elements, and
   calculates the position of each element based on a position where the respective profiles of the signal intensities of the two or more elements intersect in the predetermined direction.

3. The magnetic resonance imaging apparatus according to claim 2,
   wherein a point between two positions where the profile of the specific element and the profiles of the elements respectively on both sides of the specific element intersect, is calculated as the position of the specific element.

4. The magnetic resonance imaging apparatus according to claim 1,
   wherein the number of the plurality of elements of the receiver coil is one in the predetermined direction, and
   wherein the subject positioning unit calculates a center of gravity of the profile of the element with respect to the predetermined direction, and sets the position of the center of gravity as the position of the element.

5. The magnetic resonance imaging apparatus according to claim 1,
   wherein the subject positioning unit calculates the profile with respect to a direction crossing the predetermined direction, and calculates the position of the receiver coil with respect to the direction crossing the predetermined direction, to align the position of the receiver coil with the imaging space.

6. The magnetic resonance imaging apparatus according to claim 1,
wherein the subject positioning unit uses a height of the subject and/or information of the imaging target site entered by an operator prior to obtaining the position of the receiver coil, to move the imaging target site to the imaging space.

7. The magnetic resonance imaging apparatus according to claim 1,
wherein the subject positioning unit calculates a position of the receiver coil by executing the pulse sequence while moving the table continuously toward the imaging space.

8. The magnetic resonance imaging apparatus according to claim 7,
wherein the subject positioning unit calculates an amount of table movement so that the position of the receiver coil is aligned with the imaging space, by subtracting the amount of table movement during the period when executing the pulse sequence and/or calculating the position of the receiver coil.

9. A subject positioning device, comprising:
a processor; and
a memory coupled to the processor, the memory storing instructions that when executed by the processor, configure the processor to:
receive nuclear magnetic field signals from a plurality of individual elements of a receiver coil,
separate the nuclear magnetic field signal signals received by the individual elements into real signals and imaginary signals,
subject each of the signals to a Fourier transform to generate a real signal image and an imaginary signal image,
sum the generated real signal image and the generated imaginary signal image and obtain an absolute value image for each element of the receiver coil, and
calculate profiles of the signal intensity respectively for two or more of the elements among the plurality of elements based on the absolute value images, and
calculate the position of each of the two or more elements based on a position where the respective profiles of the signal intensities of the two or more elements intersect in the predetermined direction,
wherein the table is moved so that the position of the receiver coil is aligned with the imaging space based on the position of the two or more elements, whereby the imaging target site is aligned with the imaging space.

10. A subject positioning method of a magnetic resonance imaging apparatus, the magnetic resonance imaging apparatus comprising: a static magnetic field generator configured to generate a static magnetic field in imaging space; a receiver coil having a plurality of individual elements configured to receive a nuclear magnetic resonance signal emitted from a subject; a table configured to place the subject thereon and to move the subject to the imaging space; a transmit coil configured to irradiate the subject placed in the imaging space with an RF magnetic field; a gradient magnetic field generator configured to apply a gradient magnetic field superimposing on the static magnetic field; and a subject positioning unit configured to control movement of the table to perform positioning for aligning an imaging target site of the subject with the imaging space, the method comprising,
irradiating the subject in the imaging space with the RF magnetic field, and allows the individual elements of the receiver coil to receive the nuclear magnetic field signal emitted from the subject, and applying the gradient magnetic field in a predetermined direction, in accordance with a predetermined pulse sequence;
separating the nuclear magnetic field signal signals received by the individual elements into real signals and imaginary signals;
subjecting each of the signals to a Fourier transform to generate a real signal image and an imaginary signal image;
summing the generated real signal image and the generated imaginary signal image and obtain an absolute value image for each element of the receiver coil;
calculating profiles of the signal intensity respectively for two or more of the elements among the plurality of elements based on the absolute value images; and
calculating the position of each of the two or more elements based on a position where the respective profiles of the signal intensities of the two or more elements intersect in the predetermined direction; and
moving a table placing the subject thereon so that the position of the receiver coil is aligned with imaging space of a nuclear magnetic resonance apparatus, thereby aligning the imaging target site with the imaging space.

* * * * *